(12) United States Patent
Beak et al.

(10) Patent No.: US 8,344,431 B2
(45) Date of Patent: Jan. 1, 2013

(54) IMAGE SENSOR HAVING REDUCED DARK CURRENT

(75) Inventors: Hyoun-Min Beak, Yongin-Si (KR); Tae-Seok Oh, Seoul (KR); Jong-Won Choi, Seongnam-Si (KR); Su-Young Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/094,891

(22) Filed: Apr. 27, 2011

(65) Prior Publication Data

US 2011/0260222 A1    Oct. 27, 2011

Related U.S. Application Data

(62) Division of application No. 12/231,101, filed on Aug. 29, 2008, now Pat. No. 7,955,888.

(30) Foreign Application Priority Data

Aug. 30, 2007  (KR) .................. 10-2007-0087905

(51) Int. Cl.
    *H01L 31/0216*    (2006.01)
(52) U.S. Cl. ................. 257/292; 257/434; 257/E31.119
(58) Field of Classification Search ..................... 438/75
    See application file for complete search history.

(56) References Cited

U.S. PATENT DOCUMENTS 7,622,319 B2 * 11/2009 Park ................................ 438/48
7,892,877 B2 *  2/2011 Kwon ............................. 438/73

* cited by examiner

*Primary Examiner* — Stephen W Smoot
(74) *Attorney, Agent, or Firm* — Monica H. Choi

(57) ABSTRACT

An image sensor includes a light receiving device, a field effect transistor, a stress layer pattern, and a surface passivation material. The light receiving device is formed in a first region of a substrate. The field effect transistor is formed in a second region of the substrate. The stress layer pattern is formed over the field effect transistor for creating stress therein to improve transistor performance. The surface passivation material is formed on the first region of the substrate for passivating dangling bonds at the surface of the light receiving device.

14 Claims, 12 Drawing Sheets

IMAGE SENSOR HAVING REDUCED DARK CURRENT

The present application is a divisional of an earlier filed patent application with Ser. No. 12/231,101 filed on Aug. 29, 2008, issued as U.S. Pat. No. 7,955,888, for which priority is claimed. This earlier filed copending patent application with Ser. No. 12/231,101 is in its entirety incorporated herewith by reference.

The present application also claims priority under 35 USC §119 to Korean Patent Application No. 10-2007-0087905, filed on Aug. 30, 2007, in the Korean Intellectual Property Office, the disclosure of which is incorporated herein in its entirety by reference. A certified copy of Korean Patent Application No. 10-2007-0087905 is contained in the parent copending patent application with Ser. No. 12/231,101.

BACKGROUND OF THE INVENTION

1. Field of the Invention

The present invention relates generally to image sensors and more particularly, to an image sensor having minimized dark current even with improved operating performance of transistors therein.

2. Background of the Invention

In general, an image sensor is a semiconductor device that generates electrical signals from sensing images. Such image sensors may be categorized as CCD (Charge Coupled Device) image sensors or CMOS (complementary metal oxide semiconductor) image sensors.

A CCD image sensor includes a dense arrangement of MOS capacitors that store and transfer charge carriers. A CMOS image sensor includes a control circuit and a signal-processing circuit surrounding an APS (Active Pixel Sensor) array and is implemented using CMOS technology. The CMOS image sensor includes MOS (metal oxide semiconductor) transistors formed as part of pixels. The outputs from the CMOS image sensor are sequentially output using a switching mechanism.

The APS (Active Pixel Sensor) array of the CMOS image sensor generates electrical signals by detecting light. A logic region surrounding the APS array processes such electrical signals generated by the APS array. Each unit pixel in the APS array includes a respective transfer gate electrode, a respective photodiode disposed to a side of the respective transfer gate electrode, and a respective floating diffusion region.

During operation of an active pixel sensor array, when light reaches a photodiode, electron-hole pairs (EHPs) are generated and accumulated. Such generated charge carriers are transferred to the floating diffusion region via a transfer transistor. As a result, the electric potential at the floating diffusion region changes, and such change of the electric potential is further detected and transferred to the output.

However, the CMOS image sensor may have dark current due to dangling bonds at the surface of the photodiodes. Such dark current deteriorates characteristics of the CMOS image sensor by generating white dots, black dots, and decreasing the operating range.

SUMMARY OF THE INVENTION

Accordingly, an image sensor includes a light receiving device, a field effect transistor, a stress layer pattern, and a surface passivation material. The light receiving device is formed in a first region of a substrate. The field effect transistor is formed in a second region of the substrate. The stress layer pattern is formed over the field effect transistor. The surface passivation material is formed on the first region of the substrate.

In an example embodiment of the present invention, the light receiving device is a pinned photodiode, and the stress layer pattern is not formed over the light receiving device. For example, the pinned photodiode includes an N-type junction formed in the substrate that is P-type, and a P-type junction formed in the N-type junction. The P-type junction is formed from a top of the substrate, and the surface passivation material is formed to abut the P-type junction.

In a further embodiment of the present invention, the surface passivation material is comprise of silicon nitride containing hydrogen for passivating dangling bonds of the first region of the substrate comprised of silicon.

In another embodiment of the present invention, the substrate includes an epitaxial layer formed on a bulk substrate. In addition, the substrate includes a deep well formed at the bottom of the epitaxial layer abutting the bulk substrate. The deep well has a higher dopant concentration than the epitaxial layer and the bulk substrate. For example, the epitaxial layer, the deep well, and the bulk substrate are each of P-type conductivity.

In a further embodiment of the present invention, the field effect transistor is formed in a unit pixel region. Alternatively, the field effect transistor is formed in a logic region.

In another embodiment of the present invention, the field effect transistor includes a gate formed over the substrate. In that case, the stress layer pattern creates a tensile stress in a channel region of the field effect transistor that is an NMOSFET (N-channel metal oxide semiconductor field effect transistor), and creates a compressive stress in the channel region of the field effect transistor that is a PMOSFET (P-channel metal oxide semiconductor field effect transistor).

In a further embodiment of the present invention, the image sensor includes a plurality of field effect transistors formed in a unit pixel region, and each field effect transistor has a respective gate formed over the substrate. In that case, the stress layer pattern is formed over the respective gates of the field effect transistors in the unit pixel region. For example, the field effect transistors formed in the unit pixel region include a transfer transistor, a reset transistor, a driving transistor, and a selection transistor.

In another embodiment of the present invention, the image sensor includes a plurality of field effect transistors formed in a logic region, and each field effect transistor has a respective gate formed over the substrate. In that case, the stress layer pattern is formed over the respective gates of the field effect transistors in the logic region.

In a further embodiment of the present invention, the field effect transistor includes a gate dielectric formed on the substrate, a gate structure formed on the gate dielectric, and spacers formed at sidewalls of the gate structure and the gate dielectric. In that case, the stress layer pattern is formed onto exposed surfaces of the spacers and the gate structure. In addition, the field effect transistor includes at least one drain/source region having the stress layer pattern formed thereon.

In an example embodiment of the present invention, the stress layer pattern is comprised of silicon oxynitride (SiON).

In a further embodiment of the present invention, the surface passivation material is formed directly on the substrate in the first region, and the surface passivation material is formed directly on the stress layer pattern outside of the first region.

According to an aspect of the present invention, there is provided an image sensor including a substrate, a plurality of gate electrodes which are formed on the substrate, a photoelectric element which is formed in the substrate, wherein at least a part of the photoelectric element is formed not to overlap the gate electrode, a stress layer pattern which is formed on the substrate and the plurality of gate electrodes, and a dielectric layer for hydrogen passivation which is formed on the photoelectric element.

According to an another of the present invention, there is provided an image sensor including a substrate which a pixel region and a logic region are defined on, a plurality of transistors which are formed on the substrate in the pixel region and the logic region, a photoelectric element formed in the substrate on one side of one transistor among the transistors in the pixel region, a stress layer pattern which conformally covers the surface of the substrate and the transistors, and exposes the photoelectric element in the pixel region, and a dielectric layer for hydrogen passivation which is conformally formed according to the upside of the photoelectric element and the stress layer pattern.

According to another aspect of the present invention, there is provided a method of fabricating an image sensor. The method includes providing a substrate which a pixel region and a logic region are defined on, forming a plurality of transistors on the substrate in the pixel region and the logic region, forming a photoelectric element in the substrate on one side of the one transistor among the transistors in the pixel region, forming a stress layer pattern which conformally covers the substrate and the transistors, and exposes the photoelectric element in the pixel region, and forming a conformal dielectric layer for hydrogen passivation according to the upside of the photoelectric element and the upside of the stress layer pattern.

In this manner, the stress layer pattern generates tensile and/or compressive stress to improve operating performance of the field effect transistors in the image sensor. In addition, the surface passivation material eliminates dangling bonds at the surface of the substrate forming the photodiode for minimizing dark current in the image sensor.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and/or function.

DETAILED DESCRIPTION OF THE INVENTION

Figure 1:
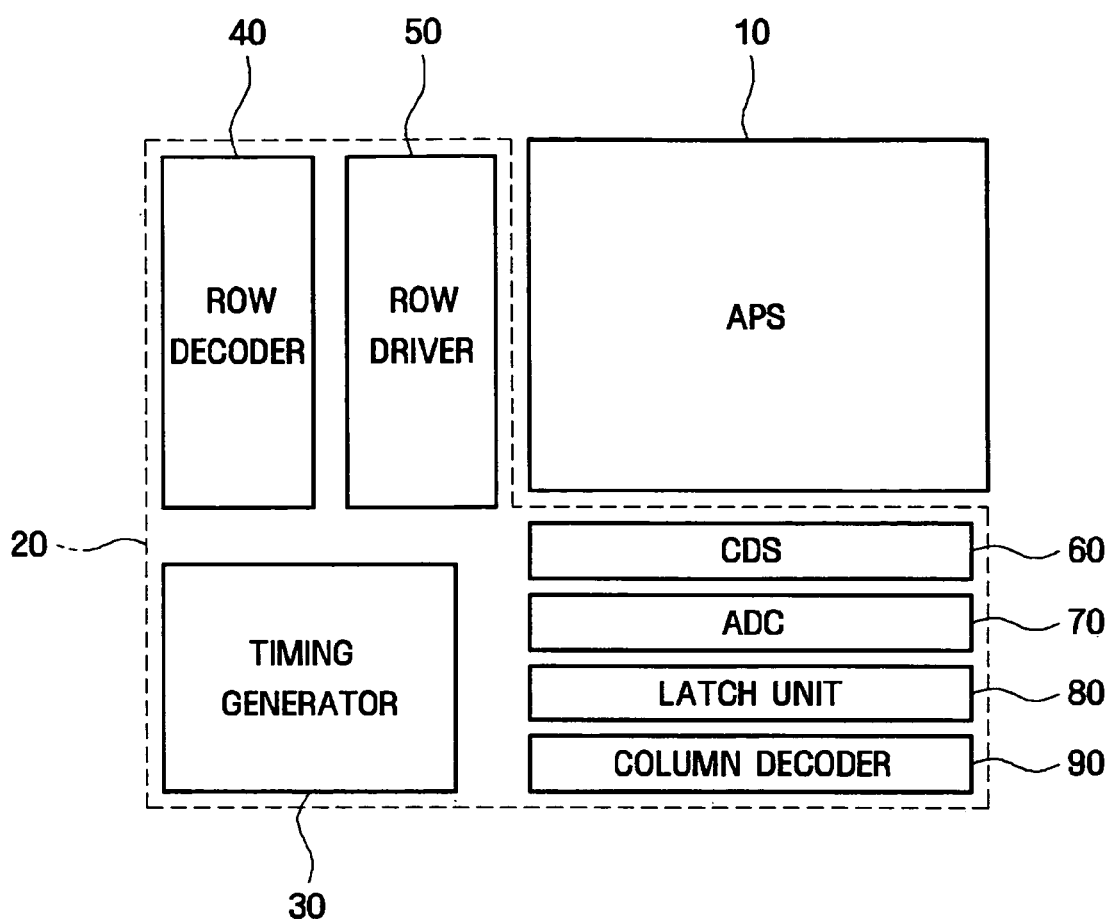
FIG. 1 is a block diagram of an image sensor according to an example embodiment of the present invention.

The present invention is now described more fully with reference to the accompanying drawings, in which example embodiments of the present invention are shown. The invention may, however, be embodied in many different forms and should not be construed as being limited to the embodiments set forth herein. Rather, these embodiments are provided so that this disclosure will be thorough and complete, and will fully convey the concept of the invention to those of ordinary skill in the art. In the drawings, sizes and relative sizes of layers and regions may be exaggerated for clarity.

It will be understood that when an element or layer is referred to as being "on" another element or layer, the element or layer may be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings.

Embodiments of the invention are described herein with reference to plan and cross-sectional views that may illustrate idealized embodiments of the invention. As such, variations from the shapes of the illustrations as a result, for example, of manufacturing techniques and/or tolerances, are to be expected. Embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Figure 2:
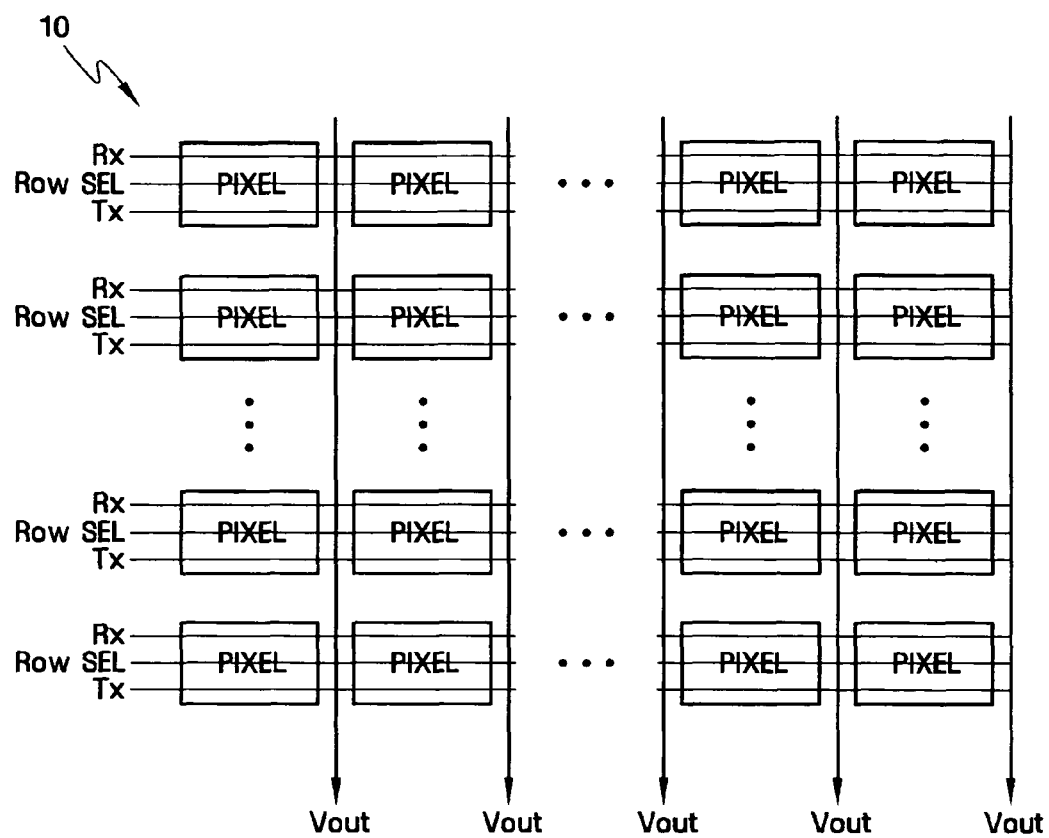
FIG. 2 is a block diagram of an active pixel sensor (APS) array of an image sensor according to an example embodiment of the present invention.

The structure of a CMOS image sensor according to an example embodiment of the present invention is described in detail with reference to FIGS. 1, 2, 3, 4, and 5. FIG. 1 is a block diagram of the CMOS image sensor according to an example embodiment of the present invention. FIG. 2 is a block diagram of an active pixel sensor (APS) array 10 in the CMOS image sensor of FIG. 1, according to an example embodiment of the present invention.

Referring to FIG. 1, the CMOS image sensor includes the APS array 10 that is a two dimensional array of pixels. The CMOS image sensor of FIG. 1 also includes a logic region 20 for controlling operation of the APS array 10 and for processing the outputs from the APS array 10.

Referring to FIG. 2, the APS array 10 includes multiple unit pixels arranged along two dimensions to form a matrix of unit pixels. Each unit pixel is implemented according to the circuit diagram of FIG. 3 in an example embodiment of the present invention. The APS array 10 converts received light into electrical signals. The APS array 10 is controlled by multiple driving signals including a pixel selection signal SEL, a reset signal RX, and a transfer signal TX provided by a row driver 50. Also, the converted electrical signals are transferred to a CDS (Correlated Double Sampler) 60 through vertical signal lines Vout.

The logic region 20 further includes a timing generator 30, a row decoder 40, the row driver 50, the correlated double sampler (CDS) 60, an analog-to-digital converter (ADC) 70, a latch unit 80, and a column decoder 90. The timing generator 30 provides the row decoder 40 and the column decoder 90 with timing signals and control signals. The row driver 50 provides the APS array 10 with the multiple driving signals SEL, RX, and TX to drive the multiple unit pixels based on the decoding result from the row decoder 40. In general, when the unit pixels are arranged in rows and columns, a respective set of the driving signals SEL, RX, and TX are provided for each row.

The correlated double sampler 60 holds and samples the electrical signals generated in the APS array 10 through the vertical signal lines Vout. In more detail, the correlated double sampler 60 double-samples a noise level and a signal level generated by the APS array 10 to output a difference between such noise and signal levels.

The analog-to-digital converter 70 converts an analog signal corresponding to the level difference into a digital signal. The latch unit 80 latches such a digital signal that is then sequentially sent to an image-signal-processing unit (not shown) based on the decoding result from the column decoder 90.

Figure 3:
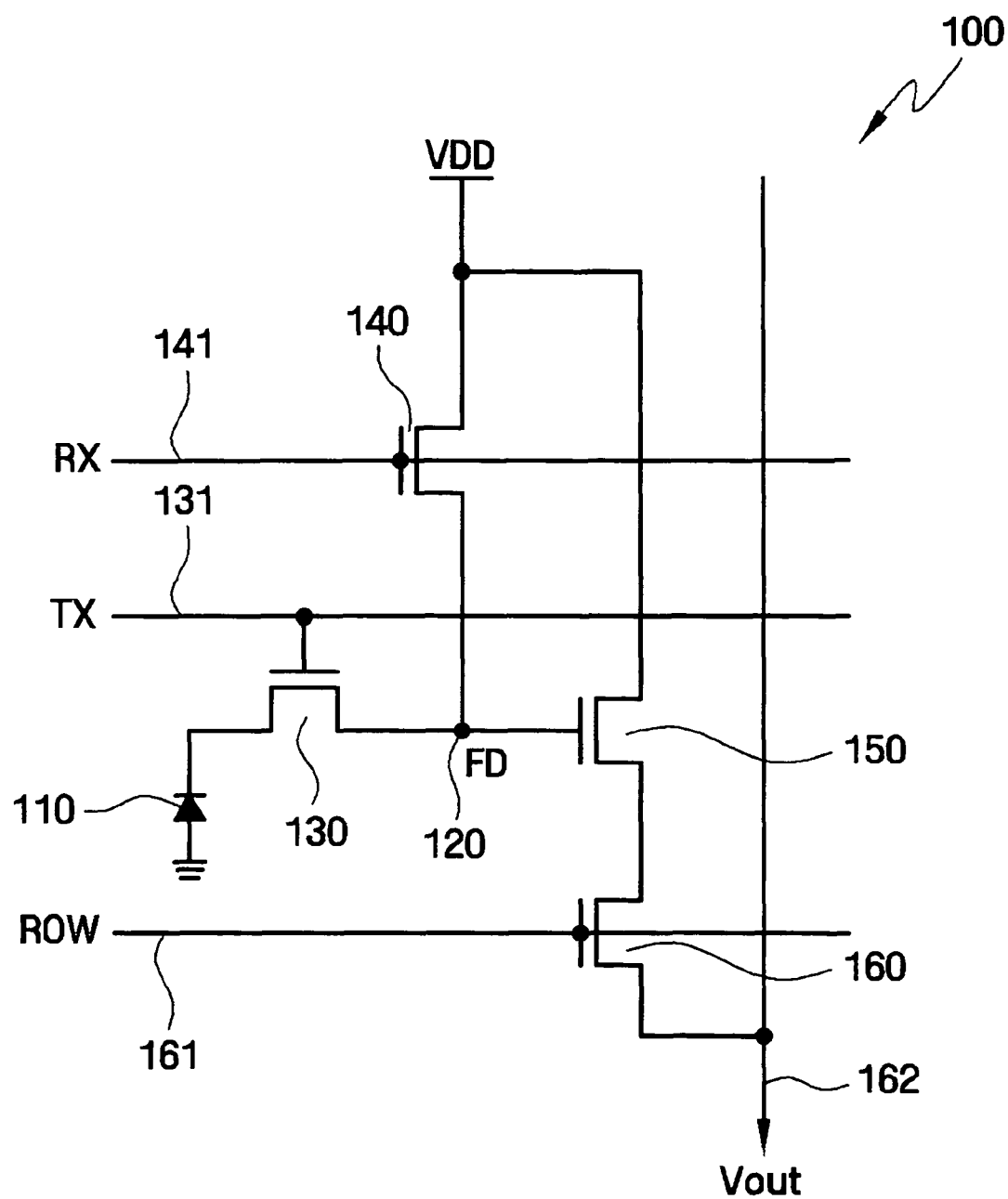
FIG. 3 is a circuit diagram of a unit pixel in the APS array of FIG. 2, according to an example embodiment of the present invention.

FIG. 3 is a circuit diagram of a unit pixel 100 in the APS array 10 of FIG. 2, according to an example embodiment of the present invention. Although FIG. 3 shows the unit pixel 100 as including four transistors, the unit pixels of the APS array 10 may also have a three transistor structure, a five transistor structure, and a photo gate structure similar to the four transistor structure.

Referring to FIG. 3, each unit pixel 100 includes a light-receiving device 110 that accumulates charge carriers from received light. Each unit pixel 100 also includes MOSFETs (metal oxide semiconductor field effect transistors) for generating electrical signals from such accumulated charge carriers. The unit pixel 100 includes a transfer MOSFET 130, a reset MOSFET 140, a driving MOSFET 150, and a selection MOSFET 160.

In more detail, the light-receiving device 110 generates and accumulates an amount of charge carriers that corresponds to an intensity of received light. The light-receiving device 110 may be a photodiode, a phototransistor, a photo gate, a pinned photodiode (PPD), or a combination of such light converting devices. The transfer MOSFET 130 transfers the charge carriers accumulated by the light-receiving device 110 to a floating diffusion region (FD) 120 in response to the transfer signal TX applied at a driving line 131.

The floating diffusion region FD 120 has a parasitic capacitance that receives and stores such charge carriers accumulated in the light-receiving device 110. The floating diffusion region FD 120 is at the gate of the driving device 150 that is a source follower amplifier.

The reset MOSFET 140 periodically resets the floating diffusion region FD 120. A source of the reset MOSFET 140 is connected to the floating diffusion region FD 120, and a drain of the reset MOSFET 140 is connected to a power voltage Vdd. The reset MOSFET 140 is driven by the reset signal RX applied at a reset line 141. When the reset MOSFET 140 is turned on by the reset signal RX, the power voltage Vdd is applied at the floating diffusion region FD 120 via the reset MOSFET 140.

The driving MOSFET 150 amplifies the electrical potential change at the floating diffusion region FD 120 for generating an electrical signal corresponding to the potential at the floating diffusion region FD 120. When the selection MOSFET 160 is turned on, the electrical signal from the driving MOSFET 150 is transferred to the output line 162.

The selection MOSFET 160 is controlled by a selection signal ROW (i.e., SEL in FIG. 2) applied at a driving line 161 for selecting the row having the unit pixel 100 to generate the electrical signals at the output line 162. The driving signal lines 131, 141, and 161 connected to the transfer MOSFET 130, the reset MOSFET 140, and the selection MOSFET 160, respectively, extend along a row direction (horizontal direction) for simultaneously driving the unit pixels in that same row.

Figure 4:
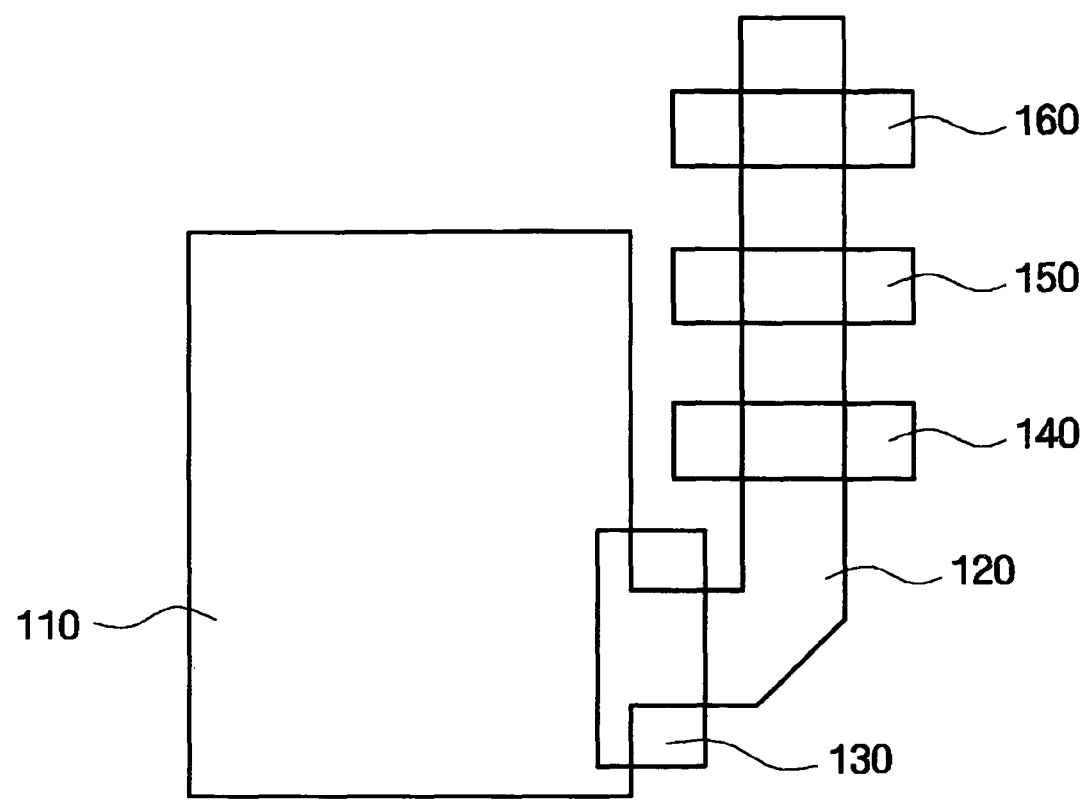
FIG. 4 is a top lay-out view of the unit pixel of FIG. 3 according to an example embodiment of the present invention.

FIG. 4 is a top lay-out view of the unit pixel 100 of FIG. 3, according to an example embodiment of the present invention. Referring to FIG. 4, a semiconductor substrate is divided into rectangular-shaped unit pixels with the APS array 10 having the unit pixels arranged in a matrix. The light-receiving device 110 is located in the center of each unit pixel. In addition, the floating diffusion region 120, the transfer MOSFET 130, the reset MOSFET 140, the driving MOSFET 150, and the selection MOSFET 160 are located in a surrounding area of the light-receiving device 110 in each unit pixel 100.

Figure 5:
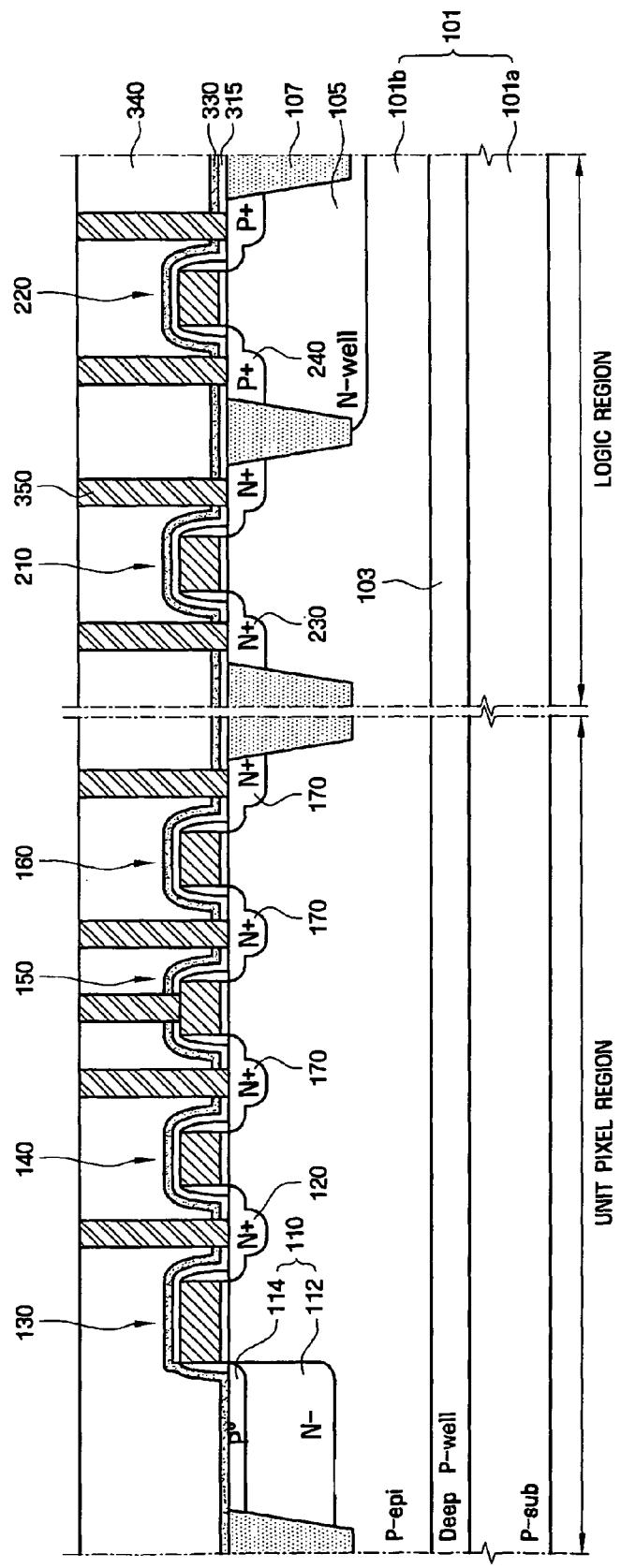
FIG. 5 is a cross-sectional view of a unit pixel region and a logic region of an image sensor according to an example embodiment of the present invention.

A logic region of the CMOS image sensor includes an integrate circuit having NMOSFETs (N-channel metal oxide semiconductor field effect transistors), PMOSFETs (P-channel metal oxide semiconductor field effect transistors), capacitors, and resistors to form a logic circuit. FIG. 5 shows a cross-sectional view of a unit pixel region and a logic region of a CMOS image sensor according to an example embodiment of the present invention.

FIG. 5 shows the components of the unit pixel 100 of FIG. 3 formed in the unit pixel region. In addition, FIG. 5 shows an example NMOSFET 210 and an example PMOSFET 220 formed in the logic region.

Further referring to FIG. 5, the CMOS image sensor is formed with a semiconductor substrate 101 having a P-type epilayer 101b formed on a P-type bulk substrate 101a. In addition, a P-type deep-well 103 is formed below the surface of the substrate 101 such as at the bottom of the P-type epilayer 101b.

The P-type deep-well 103 forms a potential barrier to prevent charges generated deep inside the P-type bulk substrate 101a from going into the light-receiving device 110. The P-type deep-well 103 is a crosstalk barrier which decreases crosstalk between pixels caused by random drift of electric charges by increasing recombination of charge carriers.

For example, the P-type deep-well 103 is formed to have a highest dopant concentration at a depth of 3 to 12 μm from the top surface of the substrate 101, and to have a layer thickness of 1 to 5 μm. Here, the depth of 3 to 12 μm is also the absorption length of red or near infrared light in silicon when the bulk substrate 101a and the epilayer 101b are comprised of silicon.

Forming the P-type deep-well 103 with a shallow depth from the top surface of the substrate 101 results in more anti-diffusion and less crosstalk. However, when the depth of the light-receiving device 110 is also shallow, the sensitivity to incident light having a long wavelength (for example, a wavelength in the red region) which has a relatively high photoelectric transformation ratio deep inside a well may be decreased. Therefore, the P-type deep-well 103 may be formed in different locations depending on the wavelength region of the incident light.

FIG. 5 shows the example of the P-type epi-layer 101b formed on the P-type bulk substrate 101a, and the P-type deep-well 103 formed in the P-type epi-layer 101b. However, the present invention is not limited thereto. For example, an N-type bulk substrate may be used instead of the P-type bulk substrate 101a, and an N-type epi-layer may be formed instead of the P-type epi-layer 101b. In addition, the present invention may also be practiced with the P-type deep-well 103 not being formed. Thus, the present invention may be practiced with the substrate 101 having various combinations of layers.

Device isolation structures 107 are formed to define active regions in the substrate 101 including to surround the unit pixel region and to surround each of the MOSFETs 210 and 220 in the logic region. Also, an N-well 105 is formed in the substrate 101 of the logic region to form the PMOSFET 220.

In the example of FIG. 5, the MOSFETs 130, 140, 150, and 160 for the unit pixel region are formed as NMOSFETs (N-channel metal oxide semiconductor field effect transistors). In more detail, each of the transfer NMOSFET 130, the reset NMOSFET 140, the driving NMOSFET 150, and the selection NMOSFET 160 has a respective gate structure formed on a respective gate dielectric on the substrate 101 and includes respective spacers formed at sidewalls of the respective gate structure and the respective gate dielectric.

In addition, each of the NMOSFET 210 and the PMOSFET 220 in the logic region has a respective gate structure formed on a respective gate dielectric on the substrate 101 and includes respective spacers formed at sidewalls of the respective gate structure and the respective gate dielectric.

Furthermore in the example of FIG. 5, the light-receiving device 110 is disposed to one side of the gate structure of the transfer MOSFET 130 within the substrate 101 in the unit pixel region. In addition, the light-receiving device 110 is formed as a pinned photodiode. In more detail, the pinned photodiode 110 includes an N-type photodiode region (i.e., an N-type junction) 112 and a P-type photodiode region (i.e., a P-type junction) 114 which are formed by two ion implantations.

Here, the N-type photodiode region 112 is formed deep inside the P-type epi-layer 101b, and the P-type photodiode region 114 is shallowly formed on the N-type photodiode region 112. As a result, the pinned photodiode 110 has a PNP junction structure including a stack of the P-type epi-layer 101b, the N-type photodiode region 112, and the P-type photodiode region 114.

The N-type photodiode region 112 absorbs incident light and accumulates charge carriers in response to the absorbed light. The P-type photodiode region 114 reduces dark current by reducing EHPs (Electron-Hole Pairs) generated by heat. The dark current may be generated from dangling bonds of silicon as a result of surface damage of the substrate 101 from etching stress. Thus, the hole in the EHP generated by heat toward the surface is diffused into the substrate 101 that is grounded through the P-type photodiode region 114. In addition, the electron in the EHP is consumed by recombination with a hole during diffusion through the P-type photodiode region 114.

The light-receiving device 110 is formed to one side of the gate structure of the transfer MOSFET 130. Further, in the unit pixel region in FIG. 5, the floating diffusion region 120 is formed by implanting an N-type dopant into the substrate 101 at the other side of the gate structure of the transfer MOSFET 130. The floating diffusion region 120 receives charge carriers accumulated in the pinned photodiode 110 through the transfer MOSFET 130. Such a floating diffusion region 120 is comprised of shallow low dopant concentration regions and a deeper high dopant concentration region.

Thus, the floating diffusion region 120 has a LLD (Light Doped Drain) structure or a DDD (Double Doped Drain) structure. In addition, on each side of the gate structures of the transfer MOSFET 130, the reset MOSFSET 140, the drive MOSFET 150, and the selection MOSFET 160 in the unit pixel region, a respective impurity region 170 having the LDD structure or the DDD structure is formed in the substrate 101. Also in the logic region, N-type source/drain regions 230 having the LDD structure are formed in the substrate 101 to the sides of the gate structure for the NMOSFET 210, and P-type source/drain regions 240 having the LDD structure are formed in the substrate 101 to the sides of the gate structure for the PMOSFET 220.

As described above, multiple field effect transistors are formed in the unit pixel region and the logic region of the CMOS image sensor according to an example embodiment of the present invention. For improving performance of each transistor, a stress layer pattern 315 is conformally formed on exposed surfaces of the gate structures, the spacers, and the substrate 101 of the MOSFETs 130, 140, 150, 160, 210, and 220.

However as illustrated in FIG. 5, the stress layer pattern 315 is not formed over the surface of the pinned photodiode 110 in the unit pixel region. Rather the surface of the substrate 101 for the pinned photodiode 110 is exposed such that a surface passivation material 330 is formed thereon to eliminate dangling bonds at such surface of the pinned photodiode 110.

In more detail, the stress layer pattern 315 is formed to generate physical stress in the channel regions of the MOSFETs 130, 140, 150, 160, 210, and 220. With such physical stress in each MOSFET, the shape of the respective energy band in the respective channel region is changed for improved performance of the MOSFET from increased mobility of electrons and holes during operation of the MOSFET.

The stress layer pattern 315 generates a tensile stress or a compressive stress for each MOSFET to change performance of the MOSFET. Performance may be improved by applying tensile stress for an NMOSFET, and by applying compressive stress for a PMOSFET. Generally, the stress layer pattern 315 applies tensile stress or compressive stress to each MOSFET depending on the performance requirements of the MOSFET in the CMOS image sensor.

In addition, the stress layer pattern 315 may also be used as an anti-reflective layer for follow-up fabrication processes. Furthermore, the stress layer pattern 315 may be used as an etch-stop layer when forming contacts 350 to be selectively connected to the MOSFETs 130, 140, 150, 160, 210 and 220. In an example embodiment of the present invention, the stress layer pattern 315 is comprised of silicon oxynitride (SiON).

The stress layer pattern 315 is removed from the pinned photodiode 110 that may have surface damage from ion implantation or an etch process. A combination of silicon and oxygen may disassociate on the surface of the pinned photodiode 110 to generate undesired dangling bonds on such a surface. A silicon atom on a silicon interface that is in a state of being an incomplete crystal tends to form a stable structure by combining with charge carriers during current conduction resulting in current loss. Thus, such dangling bonds at the surface of the pinned photodiode 110 may cause undesired dark current.

For eliminating dangling bonds on the surface of the pinned photodiode 110, the surface passivation material 330 is formed conformally on the pinned photodiode 110 and the stress layer pattern 315. In an embodiment of the present invention, the surface passivation material 330 is a layer of a material for hydrogen passivation of the dangling bonds on the surface of the pinned photodiode 110.

In that case, the surface passivation material 330 is a dielectric material including hydrogen, and may be a material having a different etch selectivity from an oxide and polysilicon. Such hydrogen in the surface passivation material 330 eliminates the dangling bonds of the photodiode 110 by combining with the dangling bonds on the surface of the pinned photodiode 110. For example, the surface passivation material 330 is comprised of a layer of silicon nitride (SiN) formed using Plasma Enhanced Chemical Vapor Deposition. Such a silicon nitride layer has high hydrogen content as a result of being formed from $SiH_4$ gas and $NH_3$ gas. The concentration of hydrogen included in the silicon nitride layer 330 is sufficient enough to combine with the dangling bonds on the surface of the photodiode 110 to prevent dark current.

Furthermore, the surface passivation material 330 that is comprised of silicon nitride (SN) is not prone to having hydrogen escape there-from during subsequent high temperature processes. Thus, the surface passivation material 330 that is comprised of silicon nitride (SN) provides stable passivation of the dangling bonds at the surface of the photodiode 110 during fabrication of the CMOS image sensor.

Furthermore in FIG. 5, an interlayer dielectric (ILD) layer 340 is subsequently formed on the surface passivation material 33. The contacts 350 are then formed through the ILD layer 340 for selectively connecting to the MOSFETs 130, 140, 150, 160, 210, and 220. In an example embodiment of the present invention, the stress layer pattern 315 and the surface passivation material 330 may be used as first and second etch-stop layers during formation of the contacts 350. Such contacts 350 may be connected to the gate structures of the MOSFETs 130, 140, 150, 160, 210, and 220, the floating diffusion region FD 120, and the source/drain regions 170, 230, and 240 of the MOSFETs 130, 140, 150, 160, 210, and 220, in the unit pixel region and the logic region.

Figure 6:
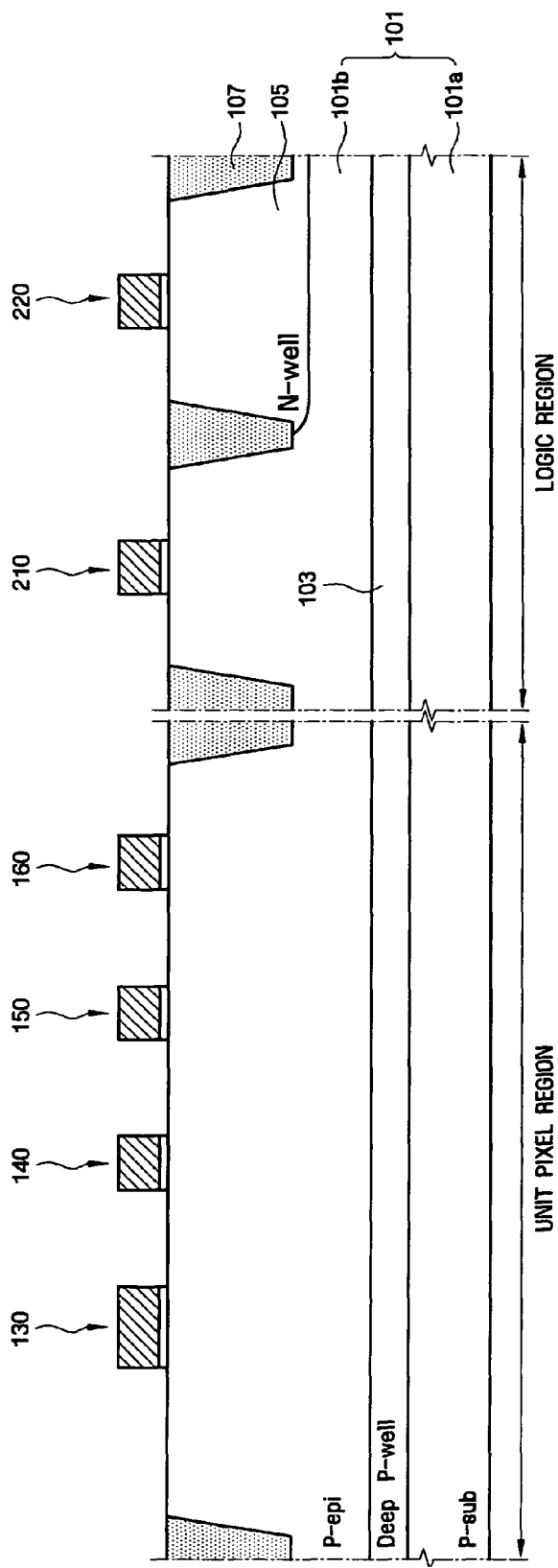
FIGS. 6, 7, 8, 9, 10, 11, and 12 are cross-sectional views of a unit pixel region and a logic region illustrating steps for fabricating an image sensor according to an example embodiment of the present invention.

The process steps during fabrication of the CMOS image sensor of FIG. 5 is now described with reference to FIGS. 6, 7, 8, 9, 10, 11, and 12, according to an example embodiment of the present invention. Referring to FIG. 6, the substrate includes the P-type epi-layer 101b formed on the P-type bulk substrate 101a. In addition, the P-type deep-well 103 is formed by ion implantation of a P-type dopant into the P-type epi-layer 101b. The P-type deep-well 103 has the highest dopant concentration at a depth in a range of from about 3 μm to about 12 μm from the surface of the substrate 101 and has a thickness of from about 1 μm to about 5 μm.

FIG. 6 shows the substrate 101 divided into the unit pixel region for having the unit pixel 100 formed therein, and into the logic region for having the example NMOSFET 210 and PMOSFET 220 formed therein. The N-well 105 is formed in the logic region by ion implantation of an N-type dopant for forming the PMOSFET 220. Subsequently, the device isolation structures 107 are formed by performing a LOCOS (Local Oxidation of Silicon) process or a STI (Shallow Trench Isolation) process to define active regions of the semiconductor substrate 101.

Next, the multiple MOSFETs 130, 140, 150, 160, 210, and 220 are formed in the unit pixel region and the logic region of the substrate 101. Referring to FIG. 6, a gate dielectric layer and a conductive layer for the gate structures are sequentially stacked. The gate dielectric layer may be comprised of at least one of $SiO_2$, SiON, SiN, $Al_2O_3$, $Si_3N_4$, GexOyNz, GexSiyOz, and a high-k material in an example embodiment of the present invention. The high-k material such as $HfO_2$, $ZrO_2$, $Al_2O_3$, $Ta_2O_5$, hafnium silicate, zirconium silicate, or a combination thereof may be formed by atomic layer deposition. Also, the gate dielectric layer may be formed by stacking of two or more of the example materials stated above. The conductive layer for forming the gate structure is comprised of polysilicon in an example embodiment of the present invention.

The stacked gate dielectric layer and the conductive layer are patterned to form a respective gate dielectric and a respective gate structure for each of the MOSFETs 130, 140, 150, 160, 210, and 220 on the substrate 101. The MOSFETs 130, 140, 150, and 160 are formed in the unit pixel region, and the MOSFETs 210 and 220 are formed in the logic region.

Figure 7:
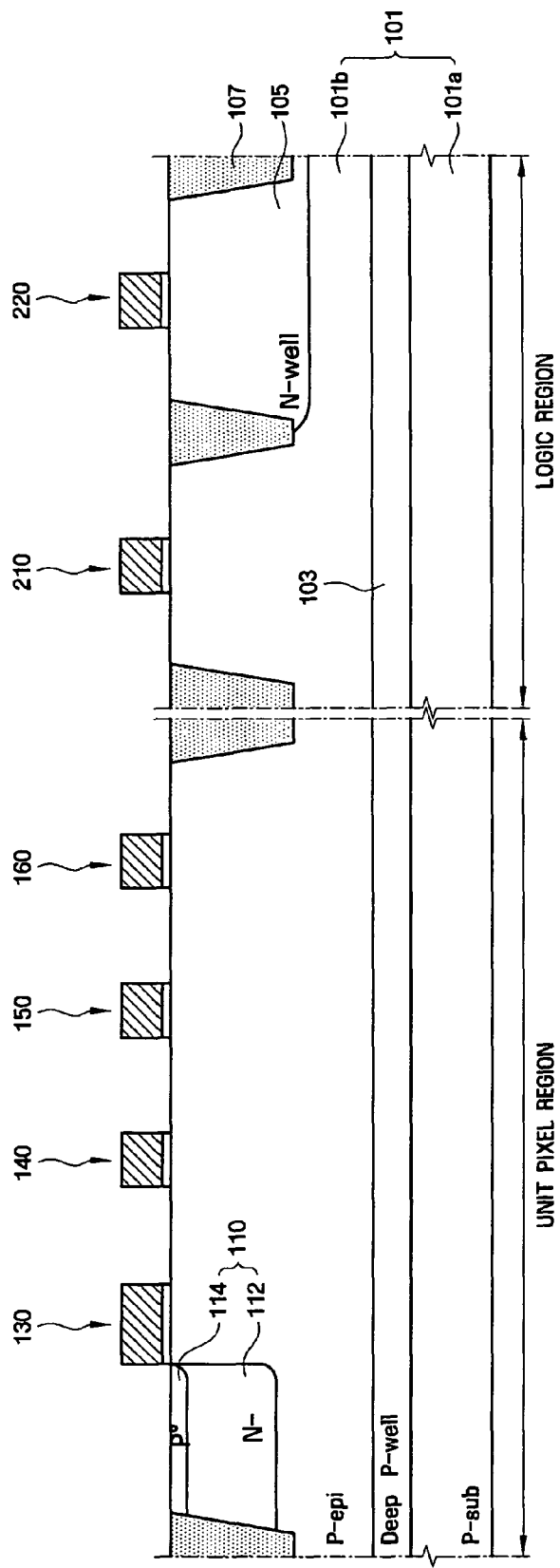

Then as illustrated in FIG. 7, a light-receiving device 110 is formed in the substrate 101 to one side of the gate structure of the transfer MOSFET 130. The light-receiving device 110 is formed as a pinned photodiode in an example embodiment of the present invention.

In more detail, a first mask pattern (not shown) is formed on the substrate 101 to selectively expose the area of the substrate 101 where the pinned photodiode 110 is to be formed. Then, an N-type dopant is ion-implanted into the substrate 101 with the first mask pattern such that the N-type photodiode region 112 is formed. When forming the N-type photodiode region 112, the ion implantation may be performed with a tilt in a range of 0 to 15° toward the direction of the gate structure of the transfer MOSFET 130. As a result, the N-type photodiode region 112 may partially overlap under the gate structure of the transfer MOSFET 130.

After forming the N-type photodiode region 112, the P-type photodiode region 114 is more shallowly doped within the N-type photodiode region 112 by implanting a P-type dopant still using the first mask pattern (not shown) that was used to form the N-type photodiode region 112. When forming the P-type photodiode region 114, the P-type dopant may be ion implanted at a tilt angle of more than 0° toward the direction of the device isolation layer 107. Such a P-type photodiode region 114 prevents dark current by reducing the electron-hole pairs (EHPs) generated by heat on the surface of the P-type epi-layer 110b.

After forming the pinned photodiode 110, the first mask pattern used to form the pinned photodiode 110 is removed. Above, the pinned photodiode 110 is described as being formed after formation of the gate structures of the MOSFETs 130, 140, 150, 160, 210, and 220. However, the present invention may also be practiced with other orders of formation of the MOSFETs and the pinned photodiode 110.

Figure 8:
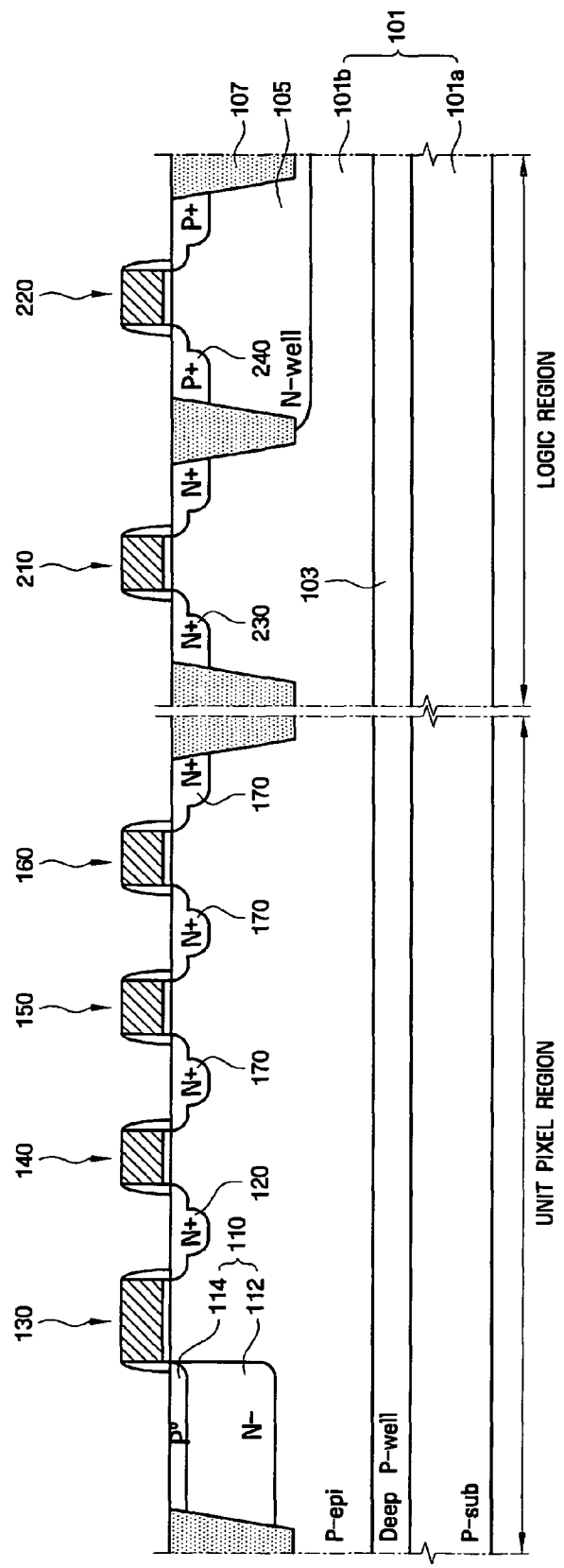

Subsequently referring to FIG. 8, spacers are formed to sides of the respective gate structure and the respective gate dielectric of each of the multiple MOSFETs 130, 140, 150, 160, 210, and 220. Such spacers may be formed by an anisotropic etching process after conformal deposition of a dielectric layer. When the doped regions (i.e., doped junctions) 120, 170, 230, and/or 240 have a LDD structure, the low dopant concentration regions may be formed before forming the spacers.

Thereafter a second mask pattern (not shown) is formed to cover the pinned photodiode 110 and to expose other portions of the substrate 101. With such a second mask pattern, the doped junctions 120, 170, 230, and 240 are formed in the substrate 101 to the sides of the gate structures of the MOSFETs 130, 140, 150, 160, 210, and 220. For example, the doped junctions 120 and 170 in the unit pixel region are formed with an N-type dopant that is same as for the N-type photodiode region 112. The doped junction 120 that is the floating diffusion region FD is formed in the substrate 101 between the gate structure of the transfer MOSFET 130 and the gate structure of the reset MSOFET 140.

Further, the source/drain junctions 230 for the NMOSFET 210 in the logic region are formed with an N-type dopant in the substrate 101 to both sides of the gate structure of the NMOSFET 210. Similarly, the source/drain junctions 240 for the PMOSFET 220 in the logic region are formed with a P-type dopant in the substrate 101 to both sides of the gate structure of the PMOSFET 220. Another mask pattern may be used for forming the P-type junctions 240.

Figure 9:
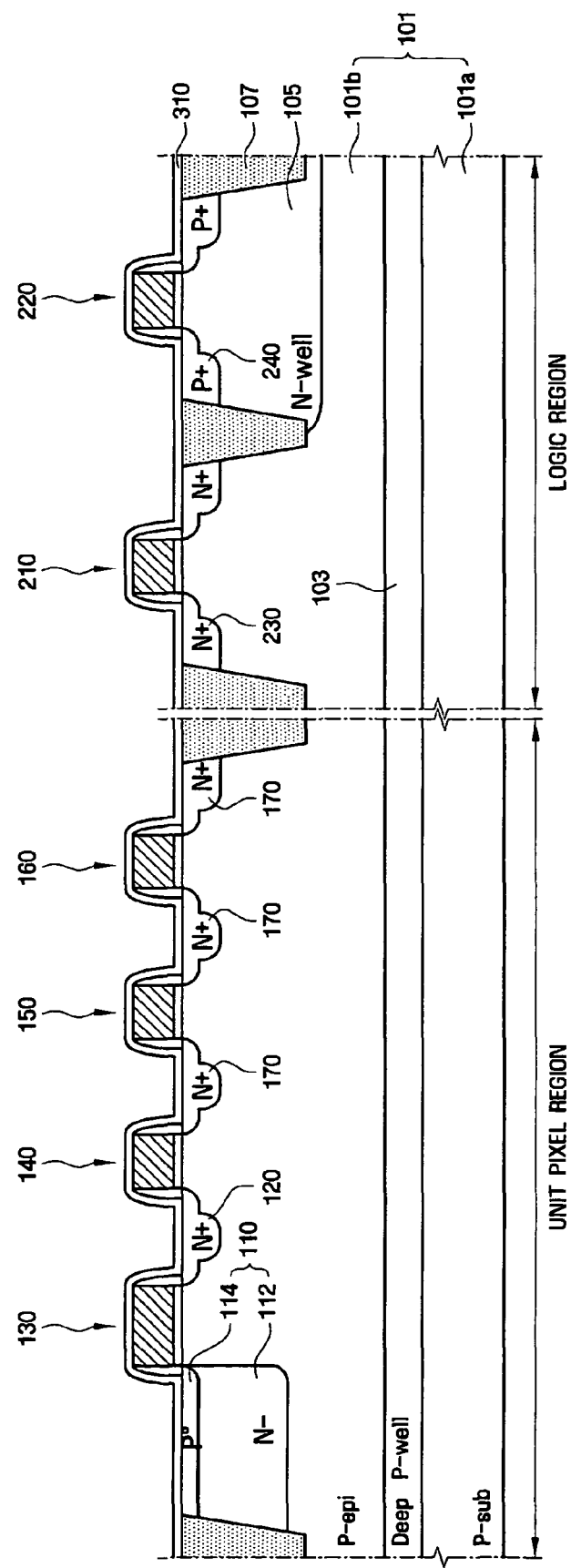

After forming the drain/source junctions 120, 170, 230, and 240, the second mask pattern covering the photodiode 110 is removed. Subsequently as illustrated in FIG. 9, the stress layer 310 is formed conformally on exposed surfaces of FIG. 8 including on the pinned photodiode 110, on the spacers and the gate structures of the MOSFETs 130, 140, 150, 160, 210, and 220, and on the impurity regions 120, 170, 230, and 240. The stress layer 310 improves transistor performance as described above by generating respective stress in the channel regions of the MOSFETs 130, 140, 150, 160, 210, and 220. The stress layer 310 is comprised of silicon oxynitride in an embodiment of the present invention.

Such a stress layer 310 may be formed by a LPCVD (Low Pressure Chemical Vapor Deposition) process or a PECVD (Plasma Enhanced Chemical Vapor Deposition) process in an example embodiment of the present invention. The stress layer 310 has a thickness in a range of from about 30 nm to about 100 nm in an example embodiment of the present invention. Such a stress layer 310 provides tensile stress or compressive stress depending on the ratio of the N—H bonds and Si—H bonds.

Initially, the stress layer 310 having tensile stress may be formed, and thereafter, different levels of stress may be formed in different areas over the substrate 101 by reducing the tensile stress of the stress layer 310 such as for the area having a PMOSFET formed therein.

The stress layer 310 that is comprised of silicon oxynitride includes a relatively small amount of hydrogen therein. However, such hydrogen within the silicon oxynitride of the stress layer 310 may be decreased during subsequent process steps performed at high temperature. Thus, the stress layer 310 may not satisfactorily passivate dangling bonds at the surface of the pinned photodiode 110.

Figure 10:
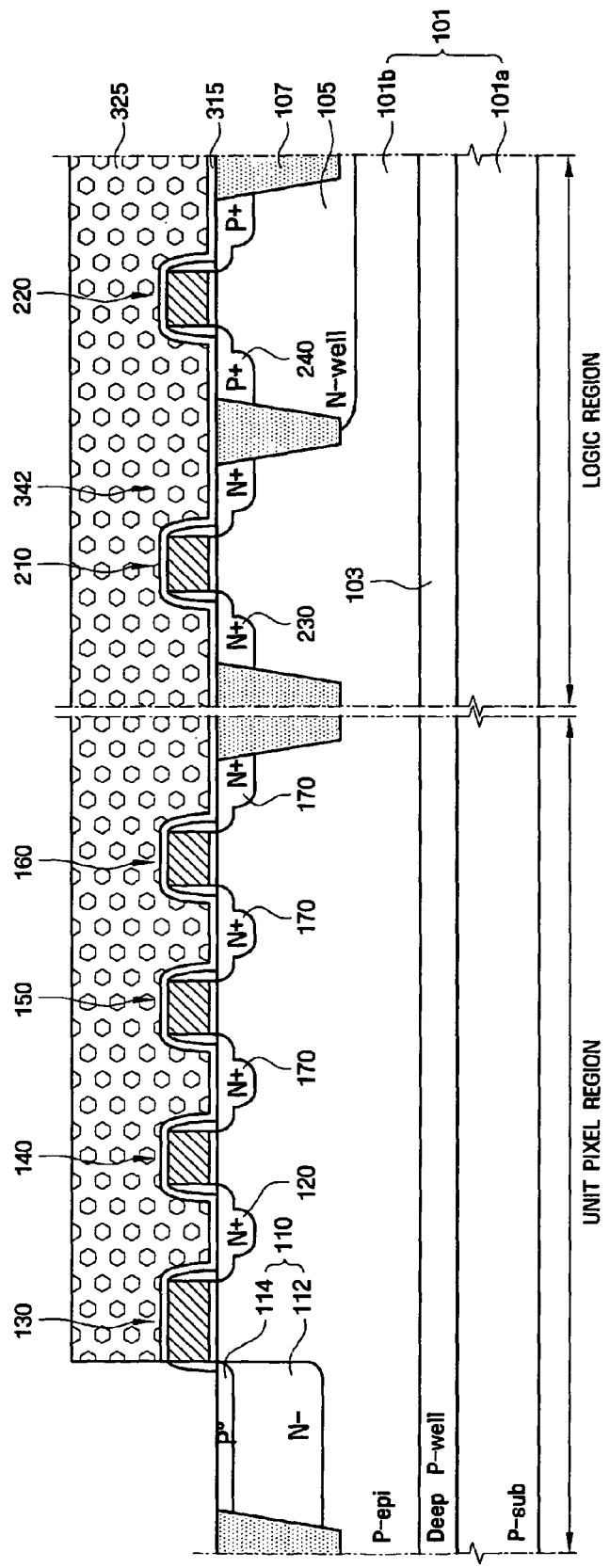

Accordingly as illustrated in FIG. 10 after FIG. 9, a mask pattern 325 is formed to expose the stress layer 310 on top of the pinned photodiode 110. Such exposed portion of the stress layer 310 on the pinned photodiode 110 is removed. As a result, a stress layer pattern 315 results that covers the MOSFETs 130, 140, 150, 160, 210, and 220 to form stress in the channels regions of such MOSFETs with the top of the pinned photodiode 110 on the substrate 101 being exposed.

Figure 11:
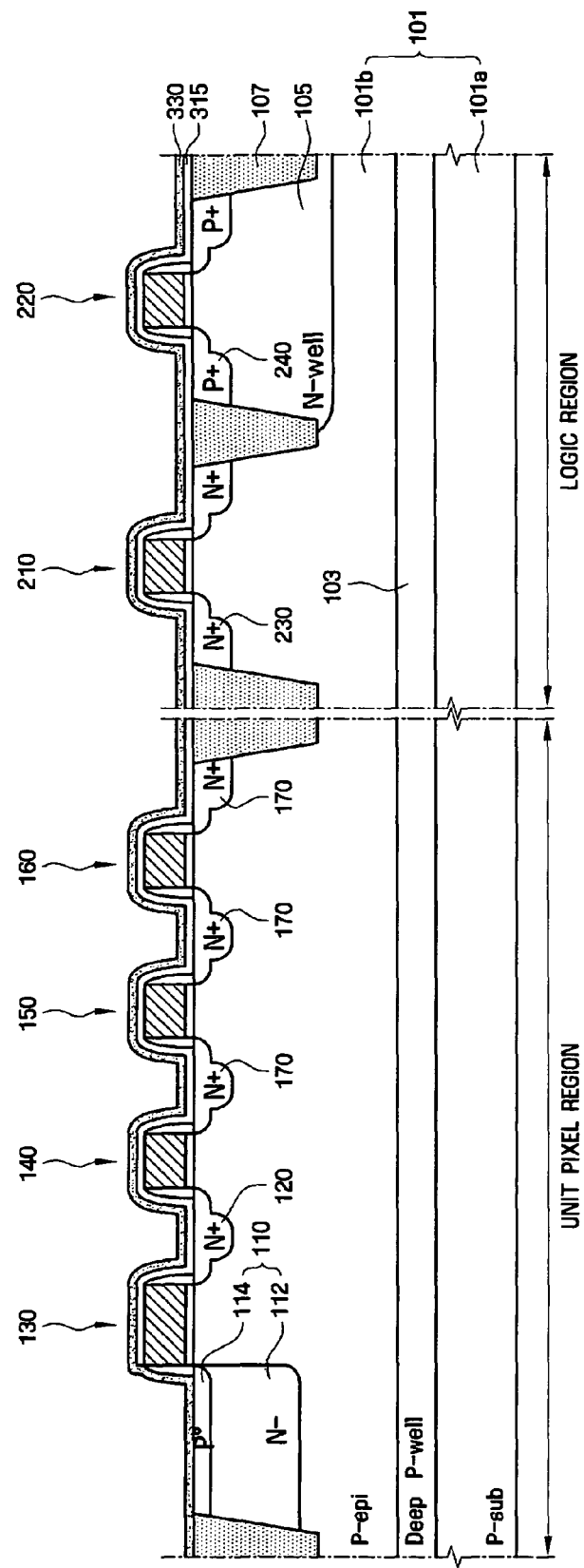
Figure 12:
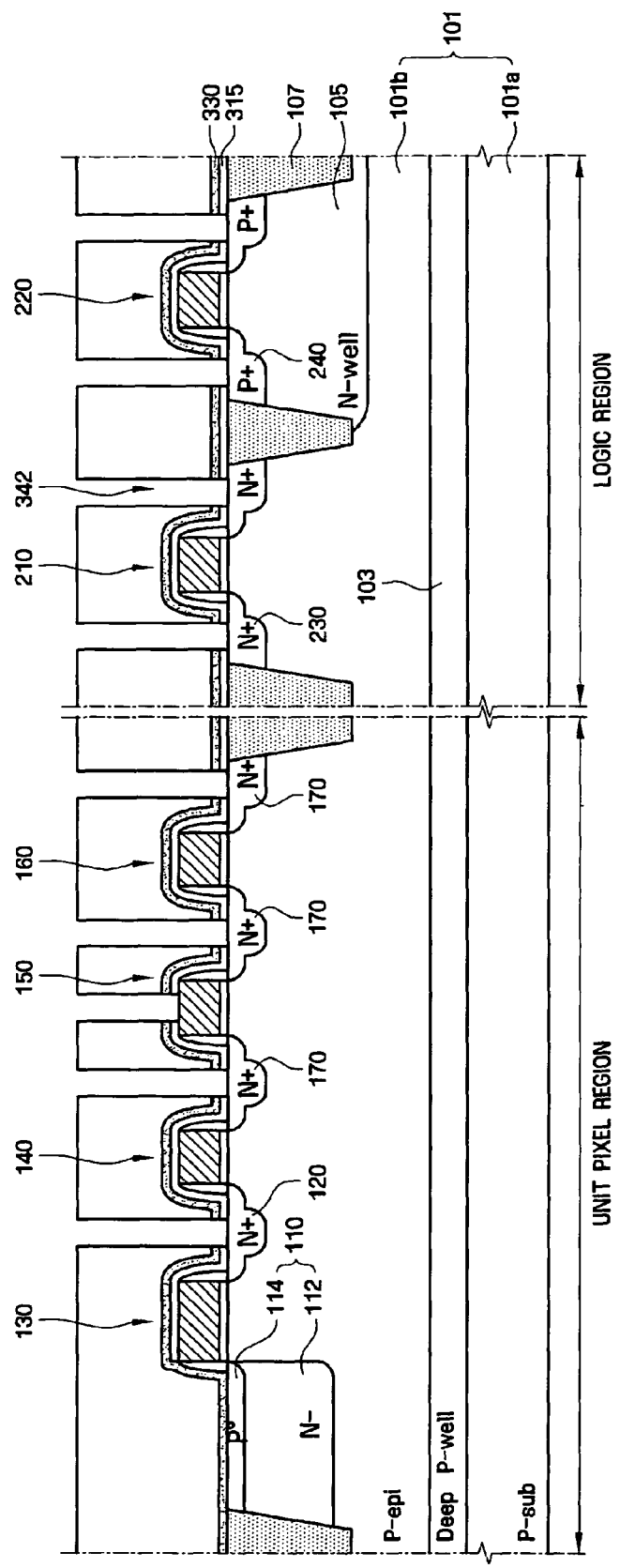

Thereafter referring to FIG. 11, the surface passivation material 330 is conformally formed on exposed surfaces of the pinned photodiode 110 and the stress layer pattern 315. As described above, the surface passivation material 330 is a dielectric layer having relatively high hydrogen content for hydrogen passivation of the dangling bonds at the surface of the pinned photodiode 110.

For example, the surface passivation material 330 is comprised of silicon nitride that has a relatively high concentration of hydrogen therein by being formed from $SiH_4$ gas and $NH_3$ gas during chemical vapor deposition. The hydrogen within such silicon nitride is combined with the dangling bonds at the surface of the pinned photodiode 110 to minimize dark current. In addition, the hydrogen within the silicon nitride does not escape from such silicon nitride even in high temperature such that the surface passivation material 330 passivates the dangling bonds at the surface of the pinned photodiode 110 even during subsequent high temperature process steps.

Furthermore, the surface passivation material 330 formed on the stress layer pattern 315 has etch selectivity from an oxide. Thus, the surface passivation material 330 may be used as an etch-stop layer when forming the contacts 350 of FIG. 5. For example referring to FIG. 12 after FIG. 11, the interlayer dielectric (ILD) layer 340 is conformally formed with a sufficient thickness on the surface passivation material 330.

Thereafter, the ILD layer 340 may be subject to polishing to achieve a flat top surface of the ILD layer 340. In an example embodiment of the present invention, the ILD layer 340 is comprised of a transparent dielectric material to allow penetration of incident light therein. For example, the ILD layer 340 is formed with HDP (High Density Plasma) and/or is comprised of at least one of TOSZ (Tonen SilaZene), SOG (Spin-On-Glass), and USG (Undoped Silica Glass).

Then, a photolithography process is performed on the ILD layer 340 to form contact holes 342 to selectively expose surfaces of the gate structures and/or the impurity regions 120, 170, 230, and 240 of the MOSFETs 130, 140, 150, 160, 210, and 220. For forming the contact holes 342, a dry etch of the ILD layer 340 comprised of an oxide may be performed with the surface passivation material 330 comprised of silicon nitride acting as an etch-stop. After such selective etching through the interlayer dielectric layer 340, portions of the surface passivation material 330 and the stress layer pattern 315 exposed through the contact holes 342 are sequentially removed by over etching.

Thereafter referring to FIG. 5, the contact holes 342 are filled with a conductive material that contacts the gate structures and/or the impurity regions 120, 170, 230, and 240 of the MOSFETs 130, 140, 150, 160, 210, and 220. Such conductive material may be planarized such that the conductive material is contained within the contact holes 342 to form the contacts 350 selectively connected to the gate structures and/or the impurity regions 120, 170, 230, and 240 of the MOSFETs 130, 140, 150, 160, 210, and 220. Subsequently, a metal wiring process may be performed on the contacts 350 to electrically connect devices in the unit pixel region and/or the logic region.

In this manner, transistor performance of the MOSFETs of the CMOS image sensor is improved from generation of stress to such MOSFETs in the pixel array and the logic region of the CMOS image sensor. At the same time, the dangling bonds at the surface of the photodiode are hydrogen-passivated with stability. Thus, dark current that may be caused by such dangling bonds is minimized in the pixel array of the CMOS image sensor of the present invention resulting in improved image quality and operating characteristics of the CMOS image sensor.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

The present invention is limited only as defined in the following claims and equivalents thereof.

What is claimed is:

1. An image sensor comprising:
   a substrate;
   a plurality of gate electrodes which are formed on the substrate;
   a photoelectric element which is formed in the substrate, wherein at least a part of the photoelectric element is formed not to overlap one of said gate electrodes;
   a stress layer pattern which is formed on the substrate and the plurality of gate electrodes; and
   a dielectric layer for hydrogen passivation which is formed on the photoelectric element without the stress layer pattern being formed directly over the photoelectric element.

2. The image sensor as claimed in claim 1, wherein the dielectric layer for hydrogen passivation is extended on the stress layer pattern.

3. The image sensor as claimed in claim 1, wherein the stress layer pattern provides one of said gate electrodes with tensile stress or compressive stress.

4. The image sensor as claimed in claim 3, wherein the stress layer pattern is formed of a silicon oxynitride layer.

5. The image sensor as claimed in claim 1, wherein the dielectric layer for hydrogen passivation is formed of a silicon nitride including hydrogen.

6. The image sensor as claimed in claim 1, further comprising an interlayer dielectric layer which is formed on the dielectric layer for hydrogen passivation; and
   a contact formed in the interlayer dielectric layer and selectively connected to the gate electrode.

7. An image sensor comprising:
   a substrate which a pixel region and a logic region are defined on;
   a plurality of transistors which are formed on the substrate in the pixel region and the logic region;
   a photoelectric element formed in the substrate on one side of one transistor among the transistors in the pixel region;
   a stress layer pattern which conformally covers the surface of the substrate and the transistors, and exposes the photoelectric element in the pixel region; and
   a dielectric layer for hydrogen passivation which is conformally formed according to the upside of the photoelectric element and the stress layer pattern.

8. The image sensor as claimed in claim 7, wherein the transistors formed on the substrate in the logic region include an NMOS transistor and a PMOS transistor.

9. The image sensor as claimed in claim 8, wherein the transistors formed on the substrate in the pixel region include a charge transmission device, a charge detection region, a reset device, an amplification device, and a selection device.

10. The image sensor as claimed in claim 9, wherein the photoelectric device is formed in the substrate on one side of the charge transmission device.

11. The image sensor as claimed in claim 7, wherein the stress layer pattern provides the transistors formed in the pixel region and the logic region with tensile stress or compressive stress.

12. The image sensor as claimed in claim 11, wherein the stress layer pattern is formed of a silicon oxynitride layer.

13. The image sensor as claimed in claim 7, wherein the dielectric layer for hydrogen passivation is formed of a silicon nitride including hydrogen.

14. The image sensor as claimed in claim 7, further comprising an interlayer dielectric layer which is formed on the dielectric layer for hydrogen passivation; and
   contacts formed in the interlayer dielectric layer that are selectively connected to the transistors formed in the pixel region and the logic region.

* * * * *